United States Patent [19]
Belopolsky et al.

[11] Patent Number: 5,733,132
[45] Date of Patent: Mar. 31, 1998

[54] SOCKET FOR CONNECTING AN INTEGRATAED CIRCUIT TO A PRINTED WIRING BOARD

[75] Inventors: Yakov Belopolsky; Alan Raistrick, both of Harrisburg, Pa.; Din-Kuen Wang, Taipei, Taiwan

[73] Assignee: Berg Technology, Inc., Reno, Nev.

[21] Appl. No.: 720,525

[22] Filed: Sep. 30, 1996

[51] Int. Cl.⁶ .................................................. H01R 9/09
[52] U.S. Cl. ................................ 439/73; 439/331
[58] Field of Search .......................... 439/73, 72, 70, 439/331, 525, 526

[56] References Cited

U.S. PATENT DOCUMENTS

| | | | |
|---|---|---|---|
| 4,018,494 | 4/1977 | Scheingold et al. | |
| 4,222,622 | 9/1980 | Griffin et al. | |
| 5,007,845 | 4/1991 | Grabbe | 439/73 |
| 5,236,367 | 8/1993 | McHugh et al. | 439/331 |
| 5,244,404 | 9/1993 | Kishi et al. | 439/331 |
| 5,273,442 | 12/1993 | Laub | 439/73 |
| 5,295,841 | 3/1994 | Grabbe et al. | 439/73 |
| 5,407,360 | 4/1995 | Belopsky | 439/71 |

*Primary Examiner*—Gary F. Paumen
*Attorney, Agent, or Firm*—Daniel J. Long; M. Richard Page

[57] ABSTRACT

Disclosed is an electrical socket for connecting a generally planar integrated circuit (IC) having a plurality of peripheral laterally extending contacts to a printed wiring board (PWB) comprising an insulative element interposed between the processing unit and the PWB and having means for retaining the IC; a plurality of latching means positioned in spaced peripheral relation adjacent the base element; a cover element superimposed over the base element and comprising an insulative housing being peripherally engageable by said latching means and a resilient control member positioned in concentric relation with said housing and having a plurality of legs each extending radially from said central section toward one of the latching means; and a plurality of contact means positioned in spaced peripheral relation adjacent the base element to abut the contacts on the processing unit and the PWB.

20 Claims, 6 Drawing Sheets

SOCKET FOR CONNECTING AN INTEGRATAED CIRCUIT TO A PRINTED WIRING BOARD

BACKGROUND OF THE INVENTION

1. Field of the Invention

The present invention relates to electrical sockets and more particularly to electrical sockets for use in connecting integrated circuits to substrates.

2. Brief Description of Prior Developments

Various sockets have been suggested for mounting a silicon integrated circuit (IC) on a substrate such as a printed wiring board (PWB). An example of such a socket is, for example, disclosed in U.S. Pat. No. 5,007,845.

Disadvantages to various prior art sockets of this type include the fact that significant force may have to be applied to the chip carrier or lead from when it is positioned on the socket. Furthermore, special tools may be required to engage or disengage the IC from the socket.

A need, therefore, exists for a zero-insertion force socket from which an IC chip may be engaged or disengaged simply and quickly and without the requirement of any special tools.

SUMMARY OF THE INVENTION

The present invention comprises an electrical socket for connecting a generally planar IC which will ordinarily have a plurality of peripheral laterally extending contacts to a PWB. This socket comprises an insulative base element interposed between the IC unit and the PWB and which includes means for retaining the IC. A cover element is superimposed over the base element and the IC. A plurality of latching means are positioned in spaced peripheral relation adjacent the base element to fix the cover to the base element. Preferably a resilient control member is positioned in concentric relation with said housing. This resilient control member has a plurality of legs each of which extends radially from said central section toward one of the latching means. A plurality of contact means is positioned in spaced peripheral relation adjacent the base element to abut the contacts on the processing unit and the PWB.

Also encompassed within the present invention is a method of mounting an IC on a PWB which comprises the steps of first interposing an insulating base element between the integrated circuit and the PWB. A cover element is then superimposed over the integrated circuit and the base element. The cover element is then peripherally latched to the base while making electrical contact is made between the IC and the PWB. The method also preferably encompasses a disengaging of the IC from the socket by applying force to the resilient control member which extends outwardly to displace the latching means from the cover element.

The present invention also includes a combination latch and contact for use in the electrical socket described above. This latch and contact comprises major resilient generally vertical member having an upper outwardly and downwardly extending cam surface superimposed over an engagement recess. A minor diagonal contact member having a terminal curved contact position adjacent a restraining projection and a base member adapted to be superimposed on the PWB which has a lower contact position with a plurality of contact points is also included.

Further, the present invention includes a resilient control member for use in removing an IC from a PWB which includes a central planar pressure application area. A plurality of major radial legs extend first outwardly from said central pressure application area then diagonally outwardly and downwardly and then outwardly. A plurality of minor radial legs are each interposed between two of the major radial legs and extend outwardly and downwardly therefrom.

BRIEF DESCRIPTION OF THE DRAWINGS

The invention is further described with reference to the accompanying drawings in which.

DETAILED DESCRIPTION OF PREFERRED EMBODIMENTS

Figure 1:
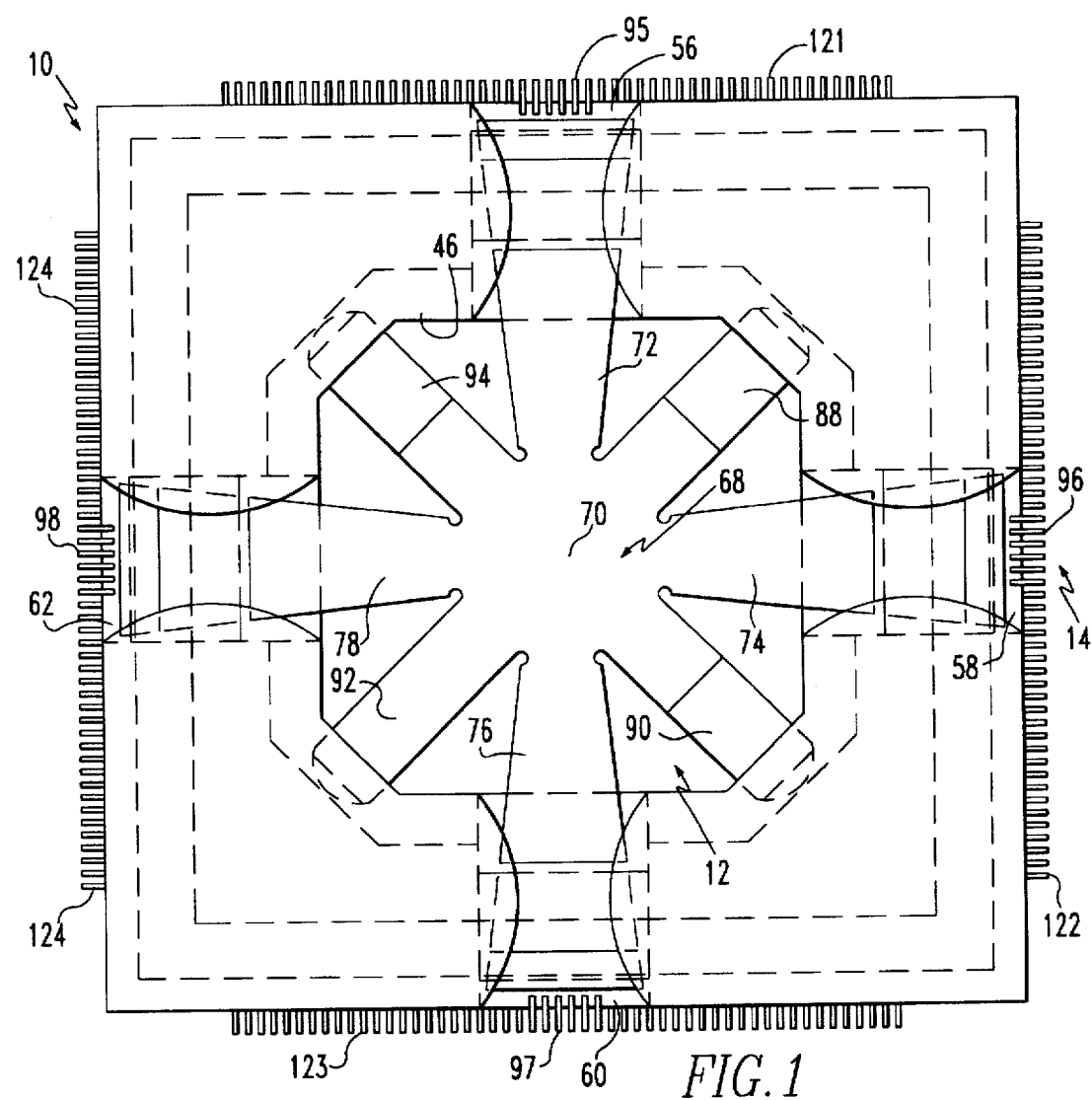
FIG. 1 is a top plan view of a preferred embodiment of the electrical socket of the present invention as it is shown in use to connect an IC to a PWB.
Figure 2:
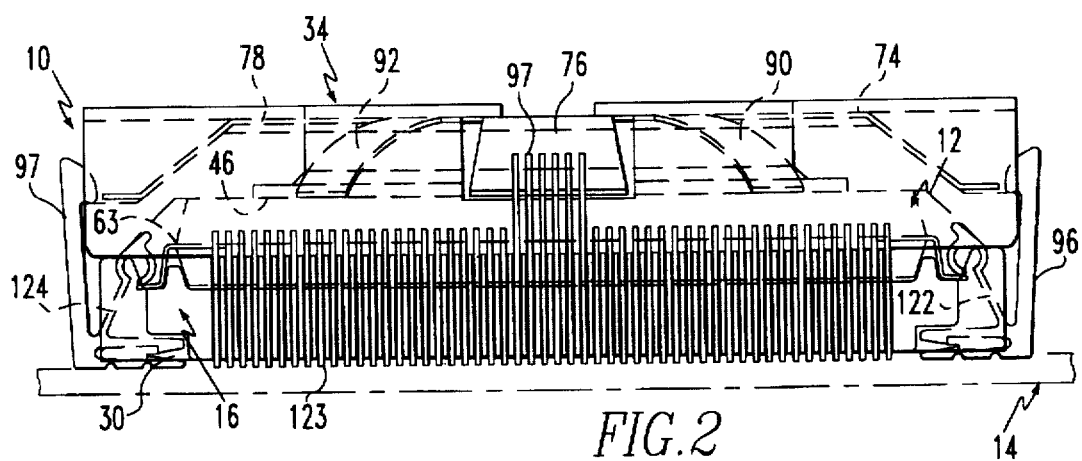
FIG. 2 is a side elevational view of the electrical socket and IC shown in FIG. 1.
Figure 4:
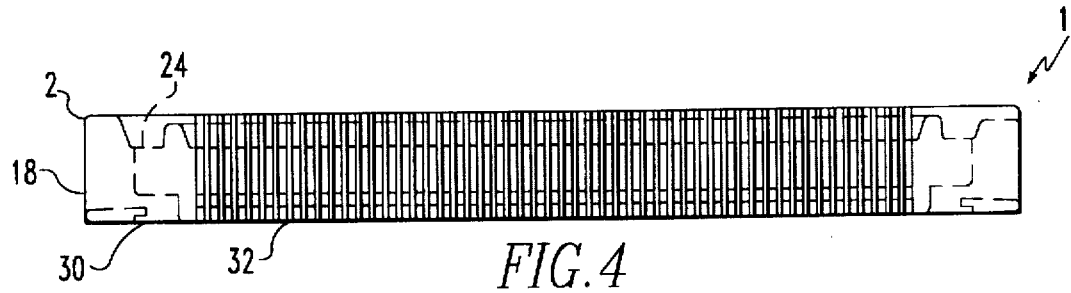
FIG. 4 is side elevational view of the base element shown in FIG. 3.
Figure 3:
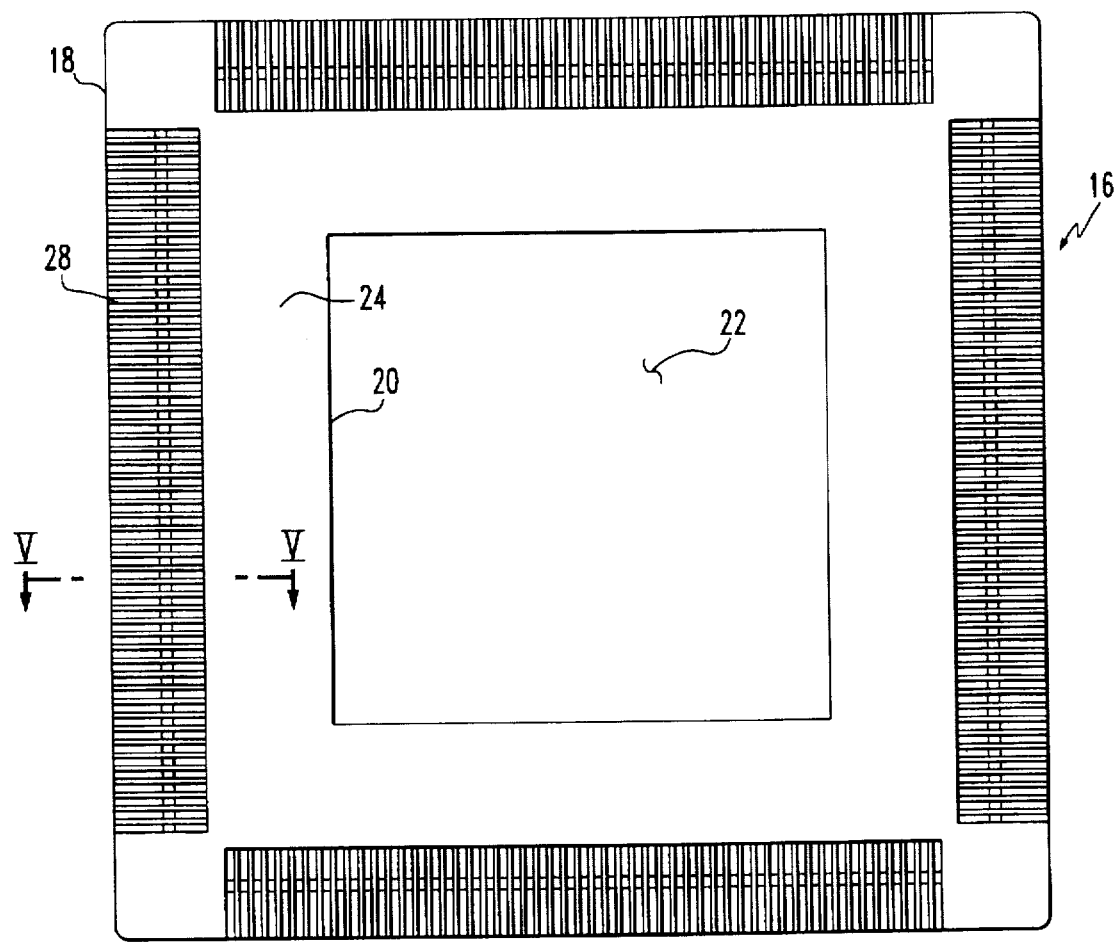
FIG. 3 is a top plan view of the base element of the electrical socket shown in FIG. 1.
Figure 5:
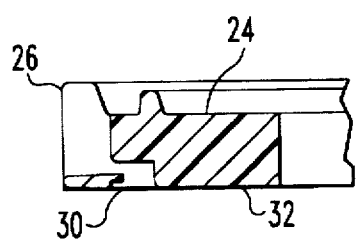
FIG. 5 is a cross sectional view through V—V in FIG. 3.
Figure 6:
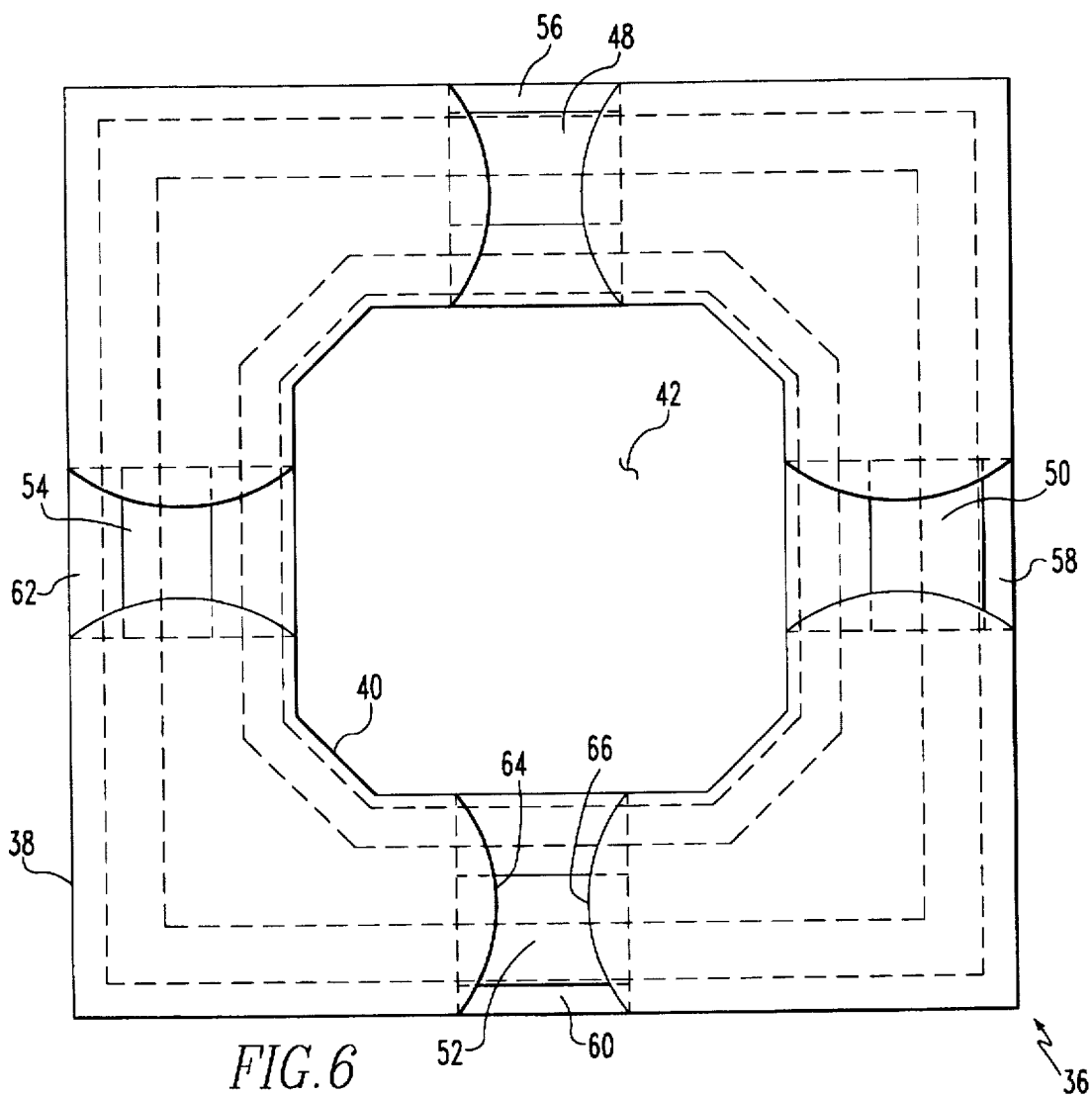
FIG. 6 is a top plan view of the insulative housing of the cover element of the electrical socket shown in FIG. 1.
Figure 7:
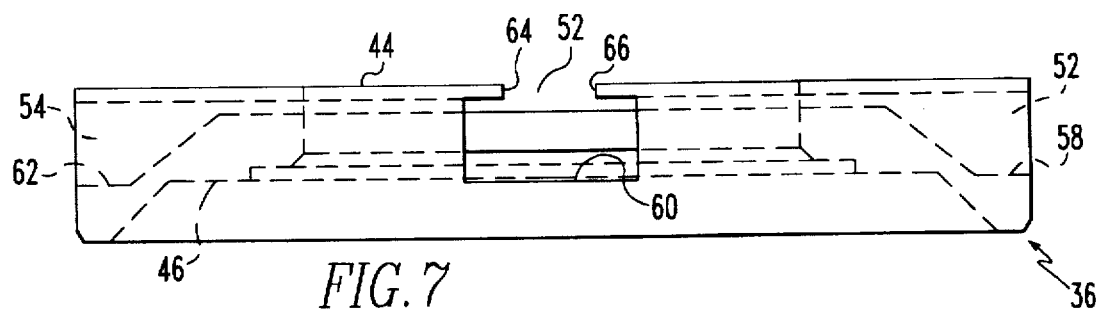
FIG. 7 is a side elevational view of the insulative housing shown in FIG. 6.

Referring to the drawings and particularly to FIGS. 1–2, the socket of the present invention is shown generally at numeral 10. In this socket there is mounted an IC which may be very large scale integrated circuit (VLSI) shown generally at numeral 12. The entire assembly is mounted on a printed wiring board (PWB) shown generally at numeral 14. Referring particularly to FIGS. 1–5, the connector has an insulative base element which is superimposed on the PWB and which is shown generally at numeral 16. The insulative base element has an outer peripheral side 18, an inter peripheral side 20 and a central space 22. It also includes a top side 24 on which there is a peripheral wall 26 and peripheral lead receiving grooves 28. At the lower end of the outer peripheral side there is an attachment strip 30, the function of which will be explained hereafter, and its bottom side 32 is fixed to the PWB by soldering or the like.

Referring particularly to FIGS. 1–2 and 6–9, the socket also includes a cover element which is shown generally at numeral 34. This cover includes an insulative housing which is shown in greatest detail at numeral 36 generally in FIGS. 6–7. This housing includes an outer peripheral side 38, an inner peripheral side 40, a central space 42, an upper side 44 and a contoured lower side 46. Between the inner and outer peripheral sides of a housing there are radial grooves 48, 50, 52 and 54. These grooves slope generally downwardly, and at the outer edges of the grooves there are respectively planar latching surfaces 56, 58, 60 and 62. On each of these grooves adjacent the upper side 44 of the housing there are longitudinal ledges such as ledge 64 and 66.

Figure 8:
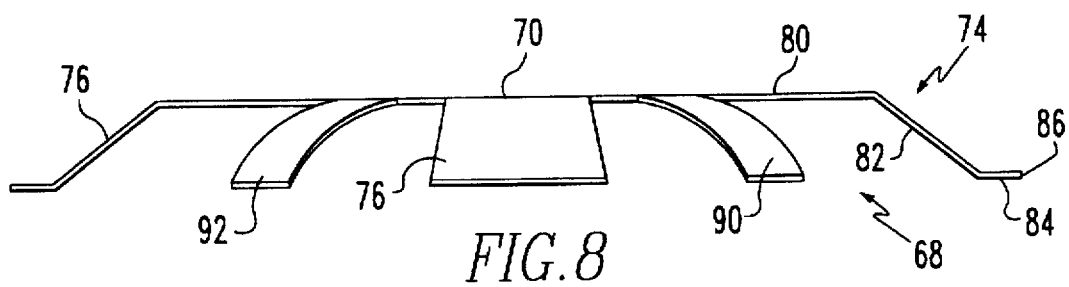
FIG. 8 is a side elevational view of the resilient control member of the cover of the socket shown in FIG. 1.
Figure 9:
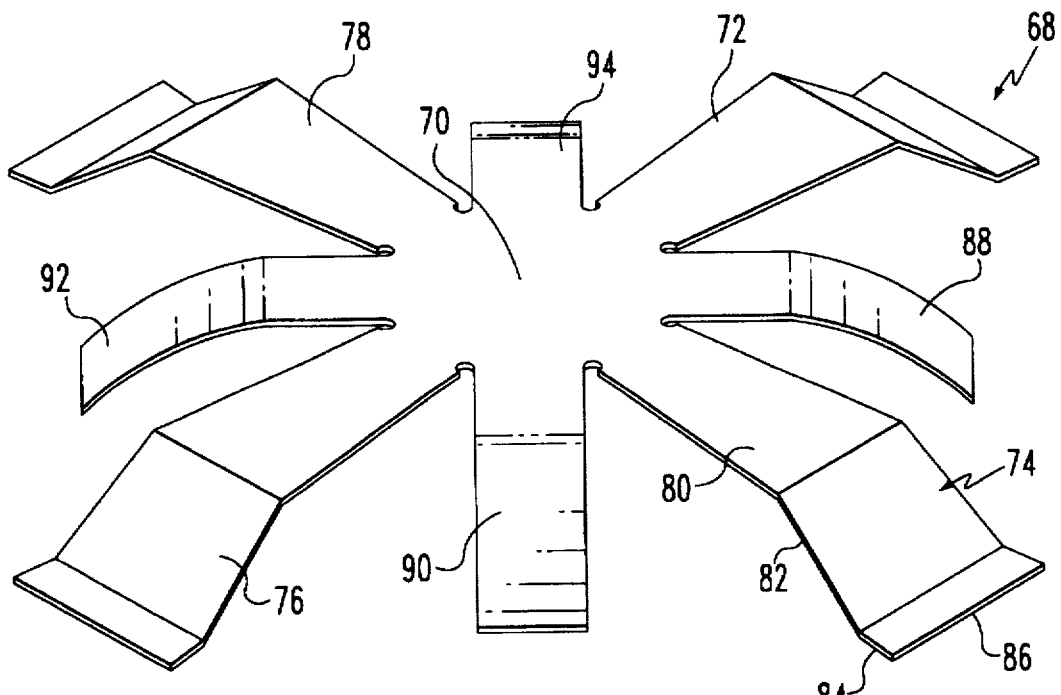
FIG. 9 is a perspective view of the resilient member shown in FIG. 5.

The cover element also includes a resilient control member which is shown in greatest detail in FIGS. 8–9 generally at numeral 68. This resilient member is preferably comprised of phosphor bronze or beryllium copper. It includes a planar central pressure application surface 70. It also includes major radial legs 72, 74, 76 and 78. Each of these horizontal legs includes an inner horizontal section 80 which extends from the central pressure application surface, a medial downwardly and outwardly extending oblique section 82 and outer horizontal section 84 which extends to terminal end 86. Between each of the major radial legs a minor radial retention legs 88, 90, 92 and 94 extend radially from the central pressure application surface. Referring particularly to FIGS. 1–2, it will be seen that each of these radial retention legs curves downwardly and outwardly to be resiliently biased against the contoured lower side 46 of the housing to help retain the resilient control member in the housing.

Figure 10:
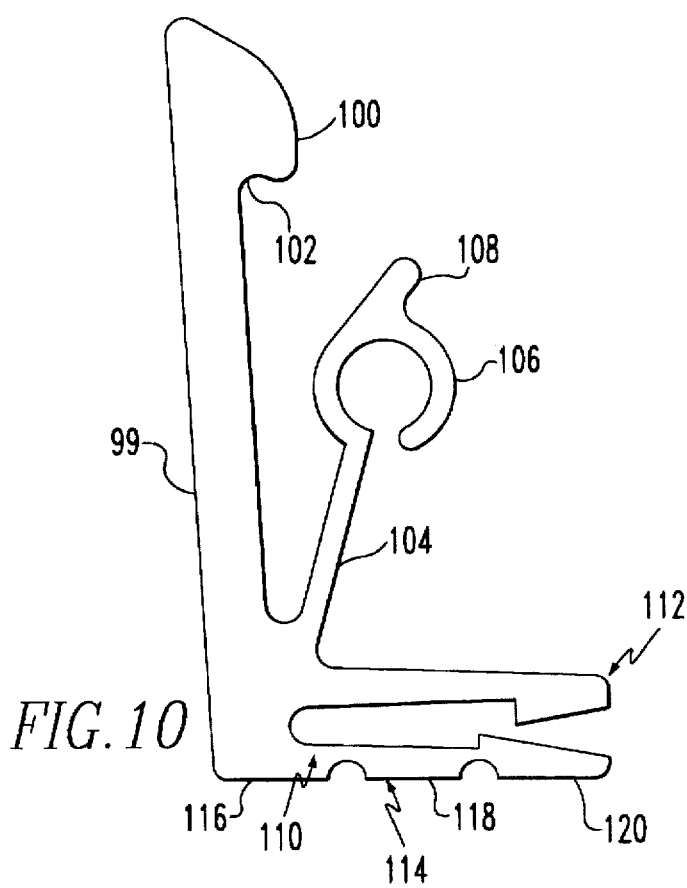
FIG. 10 is a side elevational view of a combination latch and contact used in the electrical socket shown in FIG. 1.
Figure 11:
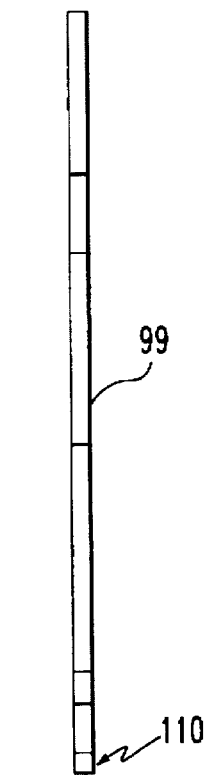
FIG. 11 is an end view of the combination latch and contact shown in FIG. 10.
Figure 12:
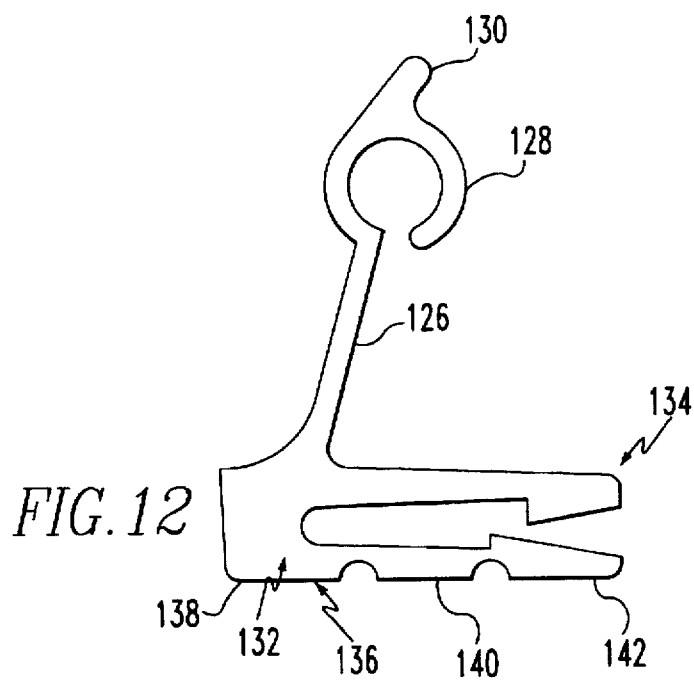
FIG. 12 is a side elevational view of a contact used in the electrical socket shown in FIG. 1.
Figure 13:
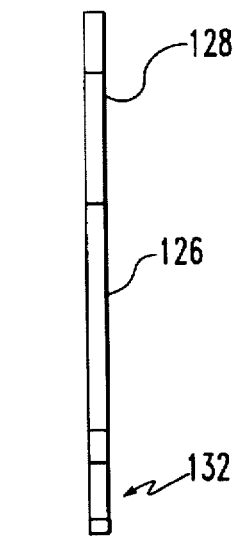
FIG. 13 is an end view of the contact shown in FIG. 12.

Referring particularly to FIGS. 1–2, the cover is retained in position relative to the base by means of a plurality of latch and contact combination fasteners as at latch 95, 96, 97 and 98 which are one of several such latches that engage, respectively, the planar latching surfaces 56, 58, 60 and 62 on the cover insulative housing. From the IC there are lateral contacts such as contact 63 which extend outwardly in a first lateral section, an oblique section and a second lateral section. As is explained below, these latches also have contact positions which bear against these IC contacts. Referring to FIGS. 10–11, each of these latches is comprised of a resilient vertical member 99 which has at its upper end a cam surface 100. Positioned beneath the cam surface there is a recess 102 for engagement of the terminal end of one of the radial legs of the resilient control member. Each of these latch contact combinations also includes a resilient diagonal contact arm 104 which has at its terminal end a curved contact position 106 which bears against one of the IC contacts and a positioning projection 108. At its lower end the latch contact combination includes a base generally at 110 which includes a clip 112 for engaging the attachment strip 30 on the insulative base element. The base section of the latch also includes a lower contact position shown generally at 114 which is made up of three separate contact points 116, 118 and 120. By having three such contact points it is possible for this same latch contact combination to be used with a variety of different metallization patterns on the PWB.

Referring to FIG. 1–2 and 12–13, it will be seen that a separate contacts as at contacts 121, 122, 123 and 124 are used outwardly adjacent the latch contact combinations on the outer peripheral side of the base. Each of these contacts has a resilient arm 126 with a terminal curved contact position 128 which bears against one of the IC contacts and which has an adjacent positioning projection 130. Each of these contacts also has a base shown generally at numeral 132 which rests on the PWB and which has a clip 134 for engagement of the attachment strip 30 on the insulative base element. This clip contacts metallized positions on the PWB by means of a lower contact position 136 which has separate contact points 138, 140 and 142 which facilitate the use of this contact with arrangement of different PWB metallization patterns.

Figure 14:
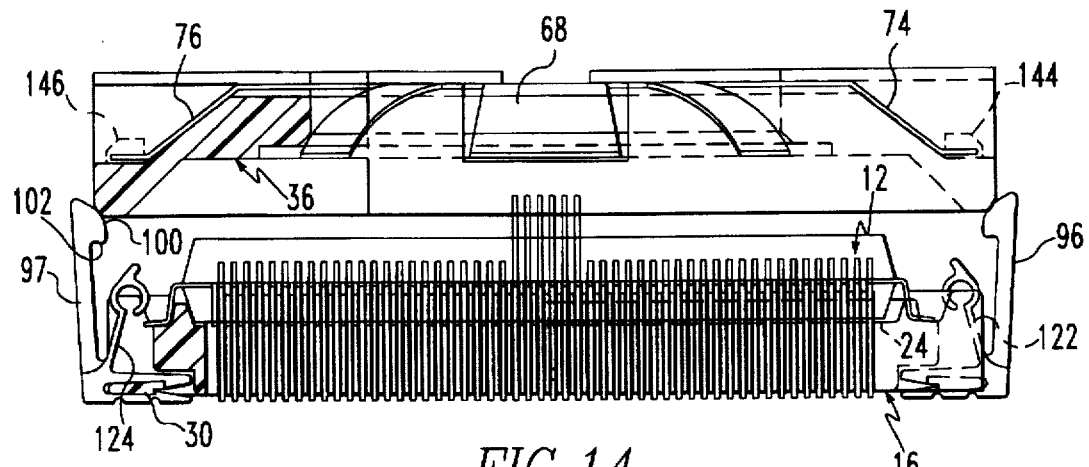
FIG. 14 is a side elevational view partially in vertical section which schematically illustrates the assembly of another preferred embodiment of the socket of the present invention.
Figure 15:
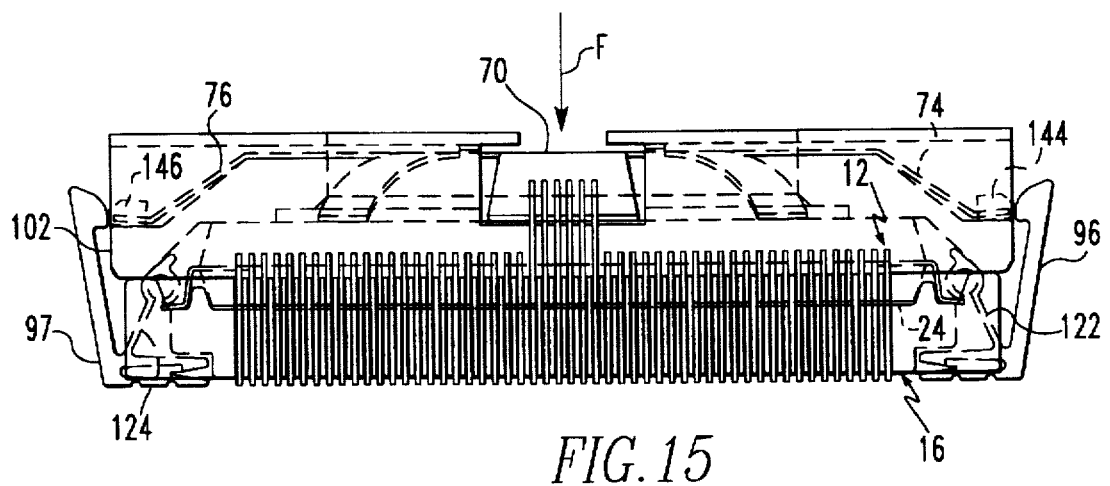
FIG. 15 is a side elevational view of the socket shown in FIG. 14 which illustrates a stage during its disassembly.

The assembly of the socket and the IC is further illustrated in FIG. 14. First the latches as at 97 and the contacts as at 124 are engaged with the base 16 at the attachment strip 30 and the IC is positioned on the top side 24 of the base 16. Then first the cover housing 36 is moved downwardly against the cam surface 100 of the latches. Then the terminal edges of the major radial legs of the resilient control member 68 are moved downwardly against the cam surface 100 of the latches until the terminal edges of the latching surface of the major legs rest in the recesses as at 102 of the latches. It will be appreciated that the use of a fewer number of latches will ordinarily decrease the necessary insertion force while the use of more latches may have advantages such as providing resistance to vibration. It will be seen that in the embodiment shown in FIG. 14 and 15, a minor modification of the resilient control member is the attached plastic strips as at 144 and 146 at the terminal ends of the major radial legs as at 74 and 76. Referring particularly to FIG. 15, the disassembly of the socket and the IC is further illustrated. First a force F would be applied on the central pressure application surface 70 of the resilient control member. The major radial legs as at 74 and 76 would flex radially outwardly to in turn flex the latches as at 96 and 97 and release the ends of the major radial legs from the recesses as at 102 in the latches. When the force F is released from the central pressure application surface 70, the major radial legs move radially inwardly to move the cover upwardly and out of engagement with the IC.

It will be appreciated that an apparatus has been described which allows a IC to be easily and inexpensively connected to or removed from a PWB without special tools or without the need to apply excessive force.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An electrical socket for connecting a generally planar silicon integrated circuit (IC) having a plurality of peripheral laterally extending contacts to a printed wiring board (PWB) comprising:

(a) an insulative base element interposed between the IC and the PWB and having means for retaining the IC;

(b) a plurality of latching means positioned in spaced peripheral relation adjacent the base element;

(c) a cover element superimposed over the base element and comprising an insulative housing being peripherally engageable by said latching means, and including a resilient control member for releasing the latching means upon application of pressure to said resilient control member, the resilient control member having a plurality of legs each extending radially from a central section thereof toward a respective one of the latching means and being positioned in concentric relation with the cover element insulative housing; and (d) a plurality of contact means positioned in spaced peripheral relation adjacent the base element to abut the contacts on the IC and the PWB.

2. The electrical socket of claim 1 wherein the contact means provide an electrical path between the IC and the PWB.

3. The electrical socket of claim 1 wherein the contact means have a rounded upper contact position for abutting the IC contacts and a planar lower contact position for abutting the PWB.

4. The electrical socket of claim 3 wherein the lower contact position on each of the contacts is superimposed over a metallized contact on the PWB.

5. The electrical socket of claim 4 wherein there are a plurality of contact points on the lower contact position so that the contacts are adapted for use with a plurality of PWB metallization patterns.

6. The electrical socket of claim 3 wherein the rounded upper contact positions abut the lateral contacts on the IC.

7. The electrical socket of claim 6 wherein the contacts are resiliently biased against the lateral contacts on the IC.

8. The electrical socket of claim 7 wherein the lateral contacts on the IC extend laterally in a first lateral section, an oblique section and then a second lateral section and the lateral upper contact position engages the second lateral section.

9. The electrical socket of claim 1 wherein means are provided to fix the contact means to the base element.

10. The electrical socket of claim 9 wherein means are provided to fix the base element to the PWB.

11. The electrical socket of claim 1 wherein means are provided to retain the resilient control element in its insulative housing.

12. The electrical socket of claim 11 wherein the resilient control member has a plurality of retention projections and said retention projections extend radially to engage the insulative housing to fix the resilient retention means to the insulative housing.

13. The electrical socket of claim 12 wherein the insulative housing has a concentric inner and outer peripheral edges and opposed upper and lower sides and the retention projections bear against the lower side of the insulative housing.

14. The electrical socket of claim 11 wherein the insulative housing has a plurality of radial grooves and each of the legs of the resilient control member is positioned in one of said radial grooves.

15. The electrical socket of claim 14 wherein axial latches adjacent the grooves retain the radial legs in said grooves.

16. The electrical socket of claim 11 wherein the radial legs of the resilient control member each have a terminal end adjacent a respective one of the latch members, and application of force on the central section of the resilient control member causes the terminal ends of each of the radial legs to be displaced outwardly against the latching means to disengage said latching means from the insulative housing of the cover element.

17. The electrical socket of claim 16 wherein the latching means are resilient and the radial legs flex the latching means outwardly to disengage said latching means from the insulative housing.

18. The electrical socket of claim 16 wherein each of the radial legs has an inner horizontal section, a medial oblique section and an exterior horizontal section.

19. The electrical socket of claim 16 wherein the retaining projections curve outwardly and downwardly from the central pressure receiving surface.

20. A resilient control member for use in removing a silicon integrated circuit (IC) from a printed wiring board (PWB) comprising a central planar pressure application area; a plurality of major radial legs each extending first outwardly from said central pressure application area then obliquely outwardly and downwardly and then outwardly; and a plurality of minor radial legs each interposed between adjacent ones of said major radial legs and extending outwardly and downwardly from said central pressure application area.

* * * * *